(12) United States Patent  
Centofante (10) Patent No.: US 7,030,316 B2  
(45) Date of Patent: Apr. 18, 2006

(54) INSERT MOLDING ELECTRONIC DEVICES

(75) Inventor: Charles A. Centofante, Los Altos, CA (US)

(73) Assignee: Piranha Plastics, Santa Clara, CA (US)

( * ) Notice: Subject to any disclaimer, the term of this patent is extended or adjusted under 35 U.S.C. 154(b) by 0 days.

(21) Appl. No.: 10/769,738

(22) Filed: Jan. 30, 2004

(65) Prior Publication Data

US 2005/0167136 A1    Aug. 4, 2005

(51) Int. Cl.  
*H01L 23/28* (2006.01)  
*H05K 5/06* (2006.01)

(52) U.S. Cl. .................. 174/52.2; 361/737; 29/841

(58) Field of Classification Search ............... 174/52.2, 174/52.3, 52.1, 52.4; 264/272.11; 361/737, 361/730, 736, 728; 439/945, 946; 29/841  
See application file for complete search history.

(56) References Cited

U.S. PATENT DOCUMENTS

| | | | | |
|---|---|---|---|---|
| 5,057,460 A | * | 10/1991 | Rose ........................... 438/133 |
| 5,196,994 A | * | 3/1993 | Tanuma et al. ............. 361/737 |
| 5,244,840 A | * | 9/1993 | Kodai et al. ................... 29/841 |
| 5,350,713 A | * | 9/1994 | Liang ........................... 438/106 |
| 5,376,824 A | * | 12/1994 | Rauchmaul et al. ........ 257/666 |
| 5,406,699 A | * | 4/1995 | Oyama ......................... 29/827 |
| 5,833,785 A | | 11/1998 | Centofante |
| 5,833,903 A | | 11/1998 | Centofante |
| 5,964,595 A | | 10/1999 | Centofante |
| 6,028,774 A | * | 2/2000 | Shin et al. ................... 361/764 |
| 6,040,622 A | * | 3/2000 | Wallace ....................... 257/679 |
| 6,085,412 A | * | 7/2000 | Iwasaki ........................ 29/827 |
| 6,137,224 A | | 10/2000 | Centofante |
| 6,139,304 A | | 10/2000 | Centofante |
| 6,295,207 B1 | * | 9/2001 | Jones ........................... 361/737 |
| 6,381,143 B1 | * | 4/2002 | Nakamura .................... 361/737 |
| 6,469,902 B1 | * | 10/2002 | Puschner et al. ............ 361/737 |
| 6,483,038 B1 | * | 11/2002 | Lee et al. ..................... 174/255 |
| 6,539,623 B1 | | 4/2003 | Chen ............................ 29/841 |
| 6,617,786 B1 | | 9/2003 | Centofante |
| 6,632,997 B1 | * | 10/2003 | Hoffman et al. ........... 174/52.2 |
| 6,779,260 B1 | * | 8/2004 | Brandenburg et al. ......... 29/841 |
| 2002/0131245 A1 | * | 9/2002 | Clayton et al. .............. 361/736 |

* cited by examiner

*Primary Examiner*—Hung V. Ngo  
(74) *Attorney, Agent, or Firm*—Fish & Richardson P.C.

(57) ABSTRACT

An apparatus and methods are provided for housing an electronic device. In one embodiment, an electronic device is positioned on a housing base and a housing lid is over-molded onto at least a portion of the base and the electronic device. An interface of the electronic device remains exposed for coupling to a second electronic device, and the housing base and housing lid form a housing partially encasing the electronic device. In another embodiment, an inset panel can be formed within the housing lid or base, for example, by positioning the panel and the electronic device within a housing base and over-molding a housing lid, while maintaining the inset panel substantially exposed. The inset panel can be formed from a material of a contrasting color to provide, for example, a label region on the housed electronic device.

32 Claims, 7 Drawing Sheets

INSERT MOLDING ELECTRONIC DEVICES

BACKGROUND

The following description relates to housing an electronic device.

Computer memory and other peripheral devices can be built into a computer or can be external devices selectively attachable to a computer through an external interface. Certain peripheral devices are now small enough to be housed in small, thin, card-shaped packages that are intended to be inserted into specially designed receptacles, typically found, for example, in portable personal computers or digital cameras. Because of the many possible methods of constructing the interface between the computer and such devices, standards have been developed by the Personal Computer Memory Card International Association ("PCM-CIA"), Japan Electronic Data Interchange Council ("JEDIC"), International Organization for Standardization ("ISO"), Compact Flash Association ("CFA"), and others. Standards specify the shape and size of the device housing as well as the design of the connector/computer interface. Such peripheral devices, which may or may not conform to an industry standard, are generally referred to as PC cards.

One method for providing a plastic housing for a PC card is to create two injection molded shells, place an electronic device between the two shells, and then mate the two shells together, for example, by sonic welding or the use of an adhesive. An alternative method is to encapsulate an electronic device by injection molding both the top and the bottom of the PC card housing at one time. In order to hold the electronic device in place during encapsulation, locating pins are placed through the electronic device during the injection molding process to suspend the electronic device in place within the mold. The resulting PC card includes holes in both the housing and the electronic device from the locating pins (which do not form part of the finished PC card).

SUMMARY

The present specification describes methods and apparatus for housing an electronic device. In general, in one aspect, the invention includes positioning an electronic device on a base, and over-molding a lid onto at least a portion of the base and a portion of the electronic device. The lid and base together provide a housing for the electronic device.

Implementations of the method may include one or more of the following features. The electronic device can be a thin walled semiconductor, printed circuit board, or a flash memory module. The electronic device can be adhered to the base prior to over-molding the lid. The base can include a recess for the electronic device. The base can include one or more raised members, and the electronic device can include one or more corresponding recesses. The electronic device can be positioned on the base by engaging the one or more raised members with the one or more recesses. The lid and/or the base can include an opening that provides access to an interface on the electronic device. The base can be plastic and the lid can be a thermoplastic material, such as an acrylonitrile butadiene styrene (ABS) or other suitable material.

In general, in another aspect, the invention includes positioning an electronic device on a base, positioning a panel on at least one of the base and the electronic device, the panel having a surface area less than the surface area of the base, and over-molding a lid onto the base and at least a portion of the electronic device, where an upper surface of the panel remains substantially exposed.

Implementations may include one or more of the following features. The panel can be plastic and can be formed by injection molding and/or die-cut. The panel can be adhered to the base and/or the electronic device.

The invention can be implemented to realize some, all, or none of the following advantages. A solid housing for an electronic device is formed, which can be stronger, more durable and hold the electronic device more firmly in place than a housing formed by mating two shells with a void between the shells. The housing can be created with reduced risk of damaging or misaligning the electronic device, as can occur when mating two shells housing an electronic device through sonic welding. A solid housing can be provided for an electronic device without the need for locator pins and corresponding holes formed in the electronic device, as can be required when encapsulating an electronic device in a single injection molding process. The risk of damage to the electronic device during injection molding is further reduced by limiting pressure on the device during molding to one direction. Further, over-molding onto a prefabricated shell can eliminate at least one fabrication step, that is, mating two shells, e.g., by sonic welding or applying an adhesive. A panel can be inset into the housing, for example, in a contrasting color to provide a region for labeling the contents of the electronic device, thereby avoiding subjecting the housed electronic device to a subsequent printing process, that could potentially damage the electronic device (e.g., pad printing a label region onto the housing).

The details of one or more embodiments of the invention are set forth in the accompanying drawings and the description below. Other features and advantages of the invention will become apparent from the description, the drawings, and the claims.

DRAWING DESCRIPTIONS

These and other aspects will now be described in detail with reference to the following drawings.

Like reference symbols in the various drawings indicate like elements.

DETAILED DESCRIPTION

Figure 1A:
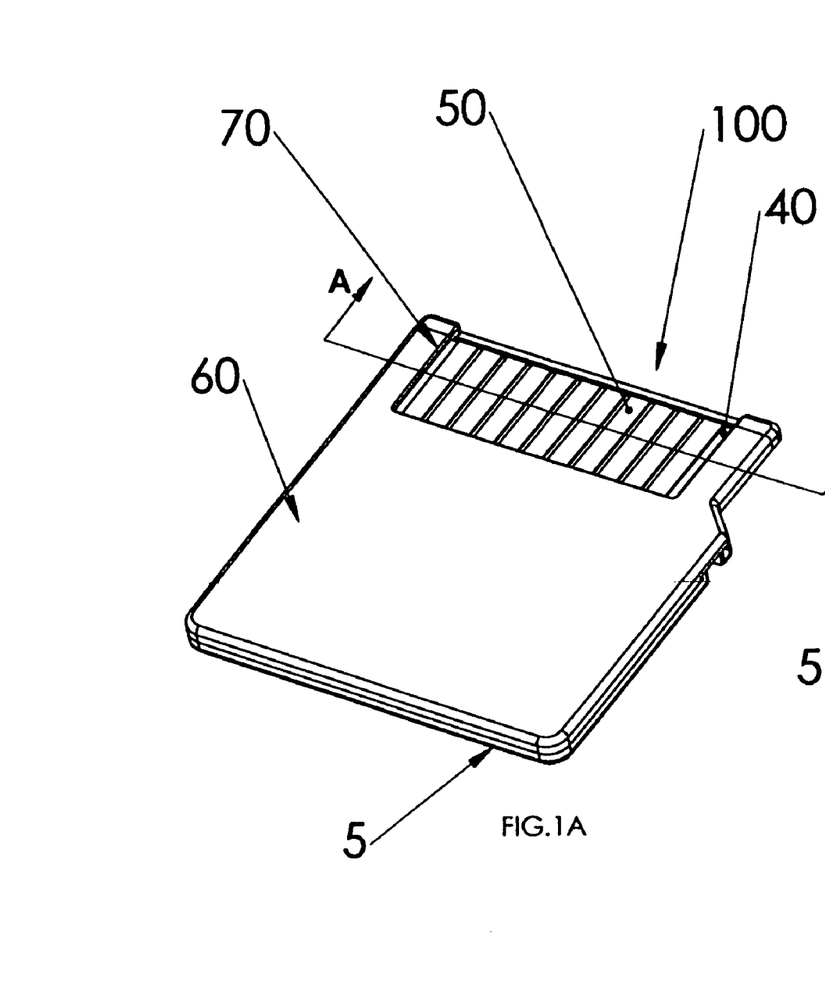
FIG. 1A shows a PC card.
Figure 1B:
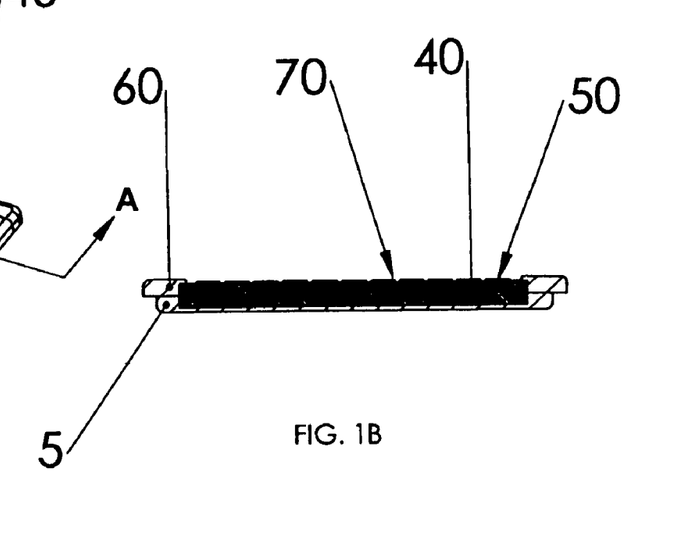
FIG. 1B is a cross-sectional view along line A—A of the PC card shown in FIG. 1A.

FIG. 1A shows a PC card 100 formed from a base 5, a lid 60, and an electronic device 40 that is partially enclosed by the base 5 and the lid 60. The base 5 is manufactured, for example, by injection molding or die-cutting. The electronic device 40 is positioned on the base, which functions as a locator during an over mold process, and lid 60 is then molded over the base 5 and at least a portion of the electronic device 40, thereby creating a solid, durable housing for the electronic device 40. The lid 60, as molded over the base 5, leaves an opening 70 that exposes a portion of the electronic device 40 including an interface 50. FIG. 1B illustrates a cross-sectional view of the PC card 100 shown in FIG. 1A taken along line A—A. The lid 60 and base 5 can be formed from an suitable material, including, for example, a thermoplastic material such as an acrylonitrile butadiene styrene (ABS), polycarbonate, ABS-polycarbonate, styrene, polystyrene, acrylic, nylon or a polyester. The above list is not exhaustive and other suitable materials to form the lid 60 and the base 5 can be used, and a different material can be used for each of the lid 60 and the base 5.

Figure 2:
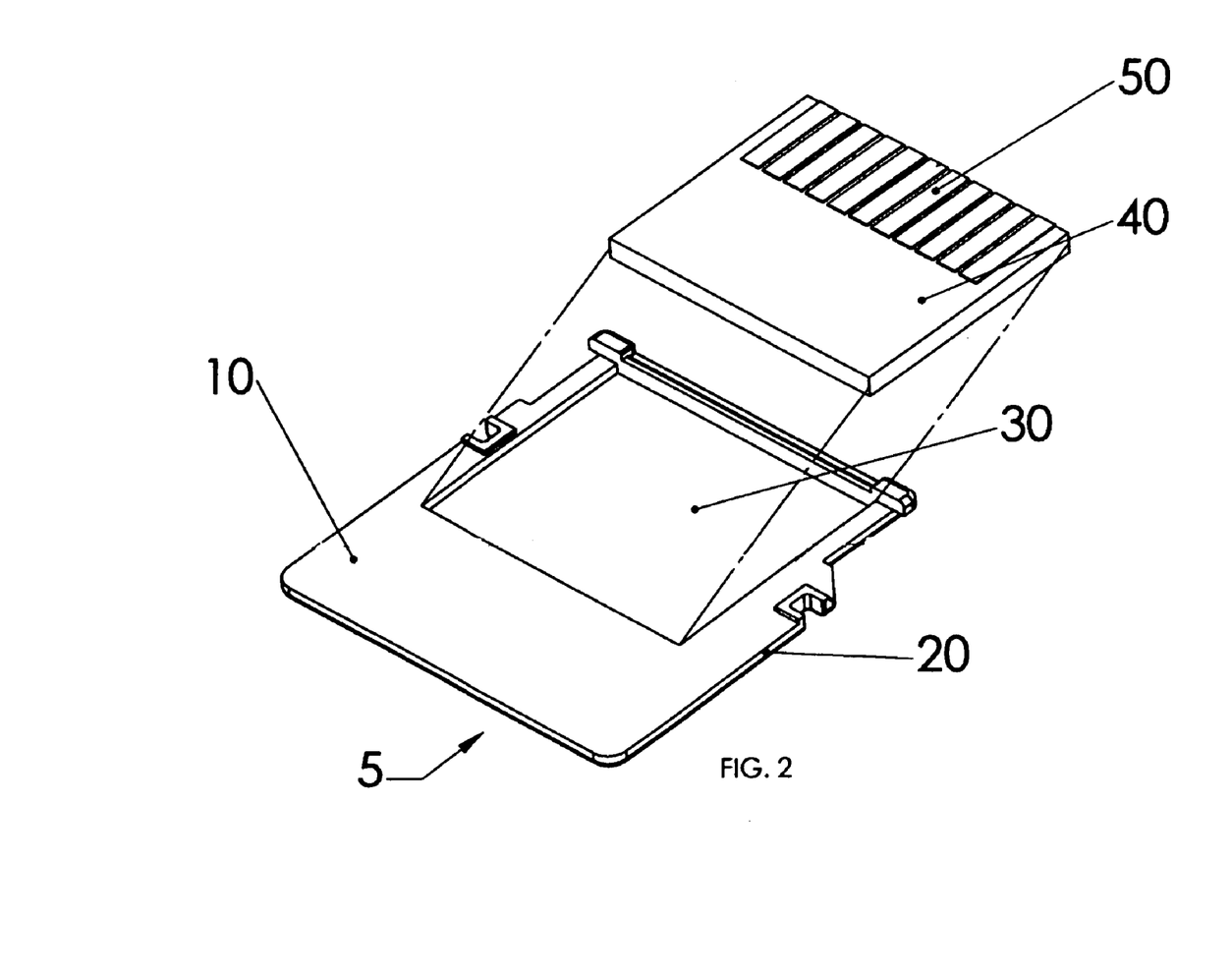
FIG. 2 is an exploded view of an electronic device and a housing base.

An embodiment of the base 5 is shown in FIG. 2, and includes a planar segment 10 and a side 20. An example of an injection molded base shell is disclosed in U.S. Pat. No. 5,833,785, issued on Nov. 10, 1998 to Centofante and entitled "Enclosing A Small-Format Electrical Device", which is hereby incorporated by reference in its entirety. An image, text or the like can be applied to the external surface of the planar segment 10 of the base 5, for example, by pad printing or ink-jet printing, prior to over-molding the lid 60 onto the base 5. The print quality of the image applied can be checked for conformity with commercial specifications. If the printing does not conform, the base 5 can be discarded without the loss of, or damage to, the electronic device 40, as can occur when printing an image on a housing after the electronic device is enclosed.

The electronic device 40 can be, for example, a thin walled semiconductor device, such as a printed circuit board (PCB) as shown. The electronic device 40 has an interface 50 that can include, for example, conductor contacts, such as gold traces, for interfacing with another electronic device. The interface 50 can be configured and attached to the electronic device 40 using conventional techniques and optionally, the interface can be configured according to a standard set by CFA, PCMICIA, JEDIC, ISO, or others. When assembled, the housing forms a thin rectilinear solid, with the lid 60 and the base 5 defining planar surfaces of the housing and a shallow side wall, and providing a rigid housing for the electronic device 40 with access to the interface 50. In one embodiment, the PC card can include a PCB configured to form a flash memory module for insertion into an electronic device such as a digital camera or a mobile phone. For example the technique can be used to form a memory module such as the miniSD memory module manufactured by SanDisk, having finished dimensions of approximately 21.5 cm×20.0 cm×1.4 mm.

Figure 3:
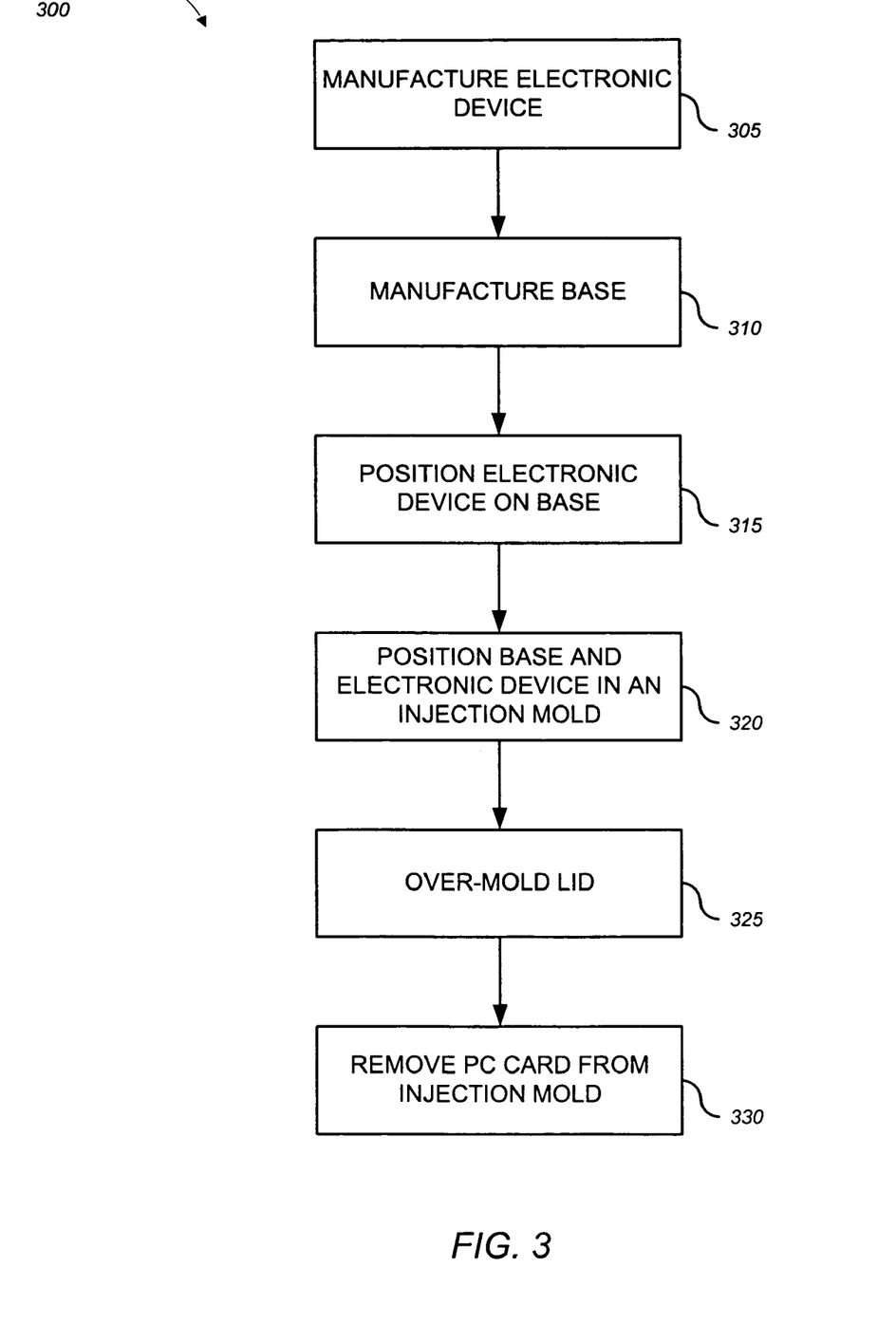
FIG. 3 is a flowchart showing a process for insert molding an electronic device.

FIG. 3 shows a process 300 for at least partially enclosing an electronic device 40 in a housing formed from a base 5 and a lid 60. The electronic device 40 is manufactured according to an industry standard or otherwise (step 305). The base 5 is manufactured (step 310), for example, using techniques described above. The order of steps 305 and 310 is not important, and either the electronic device 40 or the base 5 can be manufactured first.

Figures 5, 6:
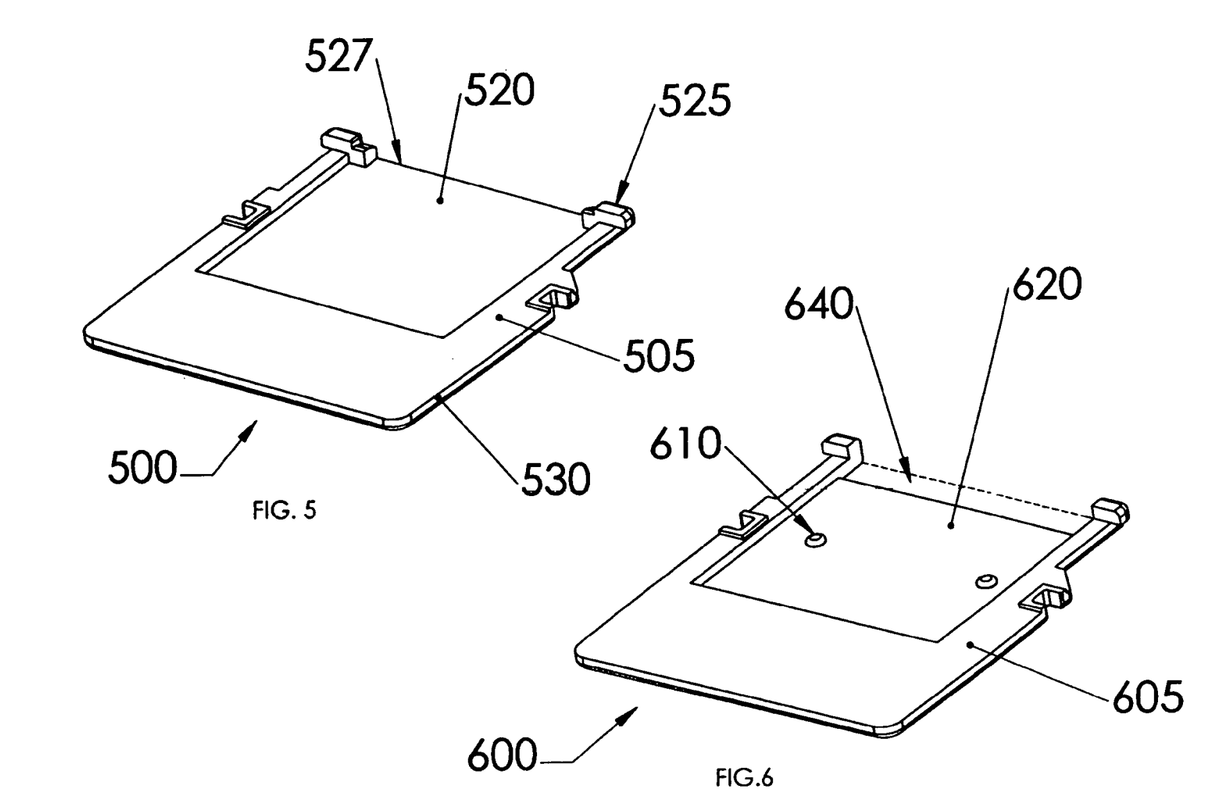
FIG. 5 shows a housing base.
FIG. 6 shows a housing base.

The electronic device 40 is positioned on the base 5 (step 315). Referring to FIG. 2, in one embodiment, the electronic device 40 can be seated within a recess 30 that provides a friction fit to hold the electronic device 40 in place during over-molding of the lid 60. Positioning the electronic device 40 in a recess 30 can also provide a thinner PC card 100. Referring to FIG. 6, in another embodiment, raised members 610 are included on a base 600 (e.g., on base 600 or within a recess 620 in base 600). The raised members 610 project sufficiently from the surface of the base 600 or recess 620 to engage a corresponding recess or formed in the electronic device 40, thereby holding the electronic device 40 in place during over-molding of the lid 60. Two raised members 610 are illustrated in FIG. 6, however any number of raised members can be used. The shape of the raised members 610 is not critical and can be, for example, conical, hemispherical, cubical, cylindrical, rectilinear, pyramid-shaped or some other configuration. Alternatively, the electronic device 40 can be positioned in a desired position on base 5 and held in place by use of an adhesive, a vacuum system or other convenient means.

Referring again to FIG. 3, the base 5 with the electronic device 40 positioned thereon is placed within an injection mold cavity that will be used to over-mold the lid 60 (step 320). This step can be eliminated if the base 5 is formed in the injection mold and the electronic device 40 is positioned on the base 5 without removing the base 5 from the mold and the same mold can be used to form the lid 60. The lid 60 is molded over the base 5 and the electronic device 40 (step 325). A shut-off mechanism is used to prevent over-molding of at least a portion of the electronic device 40, particularly the interface 50. The shut-off mechanism can be a raised portion of an interior surface of the injection mold cavity that fits against a portion of the electronic device when the mold is closed, thereby preventing any molding material from covering the area of the electronic device covered by the shut-off. The base 5 functions as a locator for the electronic device 40 during the over-mold process, thereby eliminating the need for locator pins and corresponding holes in the electronic device 40, and preventing movement of the electronic device. After the injection is complete, the mold material is allowed to harden, the injection mold 400 is opened and the resulting PC card 100 can be removed (step 330).

A description of an exemplary method and apparatus for injection molding is provided in U.S. Pat. No. 5,833,903, issued on Nov. 10, 1998, to Centofante and entitled "Injection Molding Encapsulation For An Electronic Device Directly Onto A Substrate", which is hereby incorporated by reference in its entirety.

Figures 4A, 4B:
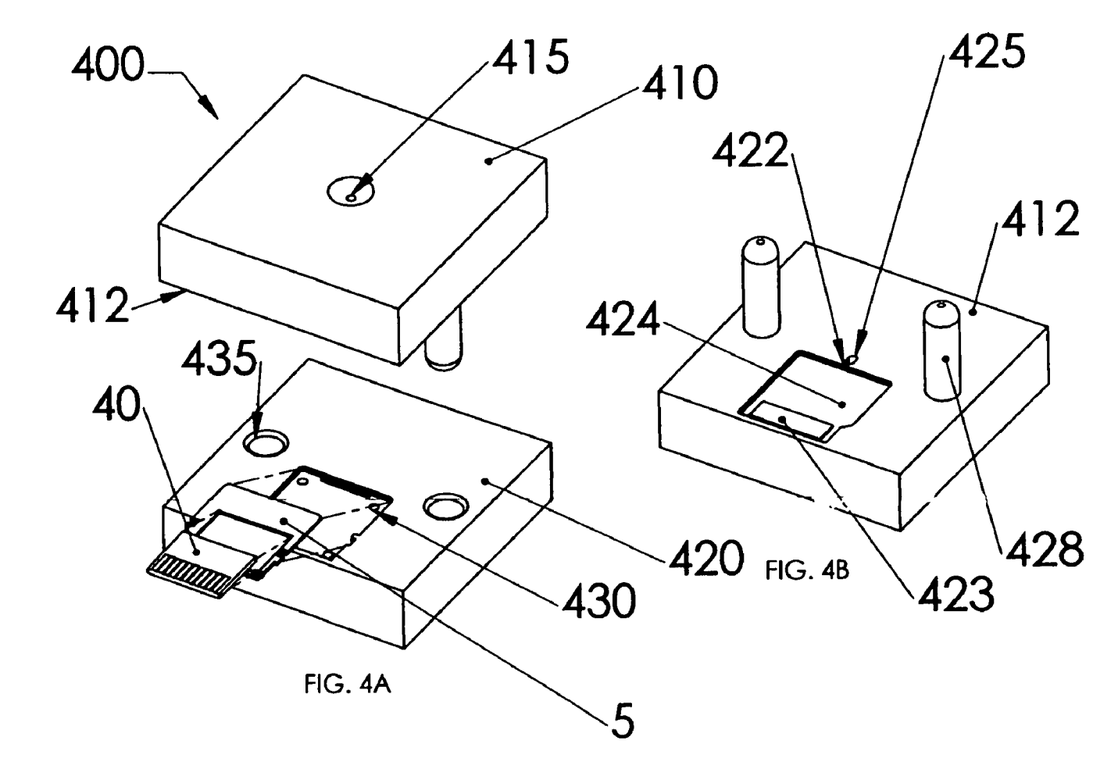
FIG. 4A is an exploded view of an injection molding apparatus.
FIG. 4B is a perspective view of a portion of the injection molding apparatus of FIG. 4A.

In one implementation, an exemplary injection molding apparatus shown in FIGS. 4A and 4B can be used to over-mold lid 60. For illustrative purposes, the technique shall be described to create a PC card 100 as shown in FIG. 1, although the technique described below in reference to FIGS. 4A and 4B can be used to form a PC card of a different configuration, such as a PC card having a base as shown in FIG. 5 or 6 (described below). Referring to FIG. 4A, the injection mold 400 includes a top plate 410 and a base plate 420. The top plate includes an inlet 415 that provides a path for injecting a mold material, such as thermoplastic, into the injection mold 400. FIG. 4B shows the inner surface 412 of the top plate 410, which includes a distribution runner 425 and a gate 422. The gate 422 can communicate with the inlet 415 through the distribution runner 425. In an alternative implementation, the gate 422 can communicate directly with the inlet 415. The gate 422 allows the thermoplastic material to enter the top mold cavity 424 which forms the shape of the over-molded lid 60. The top mold cavity 424 includes a shut off mechanism 423 that prevents thermoplastic material from covering a portion of the electronic device 40. The shut off mechanism 423 can be a raised area of the top mold cavity 424 that contacts a portion of the electronic device 40 when the mold is closed, thereby preventing a cavity from forming in this area that would receive the mold material.

The top plate 410 includes pins 428 configured to engage corresponding apertures 435 formed in the base plate 420, to couple the top and base plates. The base plate 420 includes a recess 430 for seating the prefabricated base 5 within the mold 400 during over-molding of the lid 60. An electronic device 40 is positioned on and optionally attached to the base 5 during the over-molding process. After the base 5 and the electronic device 40 are positioned within the recess 430 of base plate 420, the top plate 410 is secured to the base plate 420 with the pins 428 engaged in the corresponding apertures 435. A thermoplastic material is injected through the inlet 415 into the mold cavity 424 to cover a portion of the electronic device 40 as well as the planar surface 10 of the base 5, thereby forming the lid 60. The thickness of the lid 60 varies depending on the surface topology of the base 5. For example, the base 5 can include sidewalls and surface features of varying heights. In one embodiment, the lid 60 is over-molded so that the over-mold increases the height of the finished PC card from the base 5 by approximately 0.2 mm over the existing sidewalls of base 5.

The over-molding material can be thermoplastic material, for example, ABS, and can be the same color as the base 5 or a different color. During the injection molding process, the thermoplastic material bonds to the base 5 and to at least some portion of the electronic device 40. The heat and pressure from the injection molding process melts the surface of the base 5 that is in contact with the molding material, resulting in chemical bond between the base 5 and lid 60. Additionally, the plastic contracts as it cools forming a mechanical bond between the base 5 and the lid 60 as the lid 60 cools. Over-molding with a thermoplastic material from a similar plastic family to the material used to form the base 5 can improve bonding between the lid 60 and the base 5.

In one implementation, risk of damage to the electronic device 40 as a result of the high pressure over-mold can be reduced by injecting a first layer of plastic at low pressure to form a protective shell over the electronic device 40. The plastic can be a chemically activated thermal set material that quickly hardens. A second layer of plastic at a high pressure is then injected to complete formation of the over-molded lid. The first and second layers can be formed during a single mold process (i.e., without removing the base 5 and electronic device 40 from the mold cavity), or as a two-step molding process.

FIG. 2 shows one embodiment of the base 5 that includes an area of reduced thickness relative to the planar segment 10, which forms a recess 30 for receiving an electronic device 40. In another embodiment shown in FIG. 5, a base 500 includes an side 530 extending the entire perimeter of the base 500 with the exception of an opening 527. A recess 520 for receiving an electronic device can be formed in the base 500, such that an edge of the recess coincides with the opening 527 in the side 530 of the base 500. The electronic device 40 can be positioned within the recess 520 so that an interface on the electronic device is accessible via the opening 527 to permit interfacing with another electronic device. The recess 520 limits lateral movement of the electronic device within the base 500, thereby holding the electronic device 40 stationary during the over-molding process. The electronic device 40 is prevented from moving towards the opening 527 by partial sides 525 providing the boundary of the opening 527 and forming a partial fourth side to the recess 520.

FIG. 6 shows another embodiment of a base 600. The base 600 includes a planar segment 605 including a recessed region 620 and a notch 640 adjacent to an edge of the recess 620. The electronic device can be positioned within the recess 620, which limits lateral movement of the electronic device within the base 600 during over-molding of a lid. The electronic device can be further held in position by using the raised members 610 to engage corresponding recesses in the electronic device as described previously. The electronic device can be positioned with an interface facing toward the base 600, such that the interface is accessible through notch 640, and thus capable of forming an electrical connection with another electrical device. Alternatively, if the electronic device has an interface on both sides and/or on an end of the electronic device, then the interface can be accessed from the base side via the notch 640, and from the lid side by forming the lid such that the interface remains exposed, as described above.

Figure 7A:
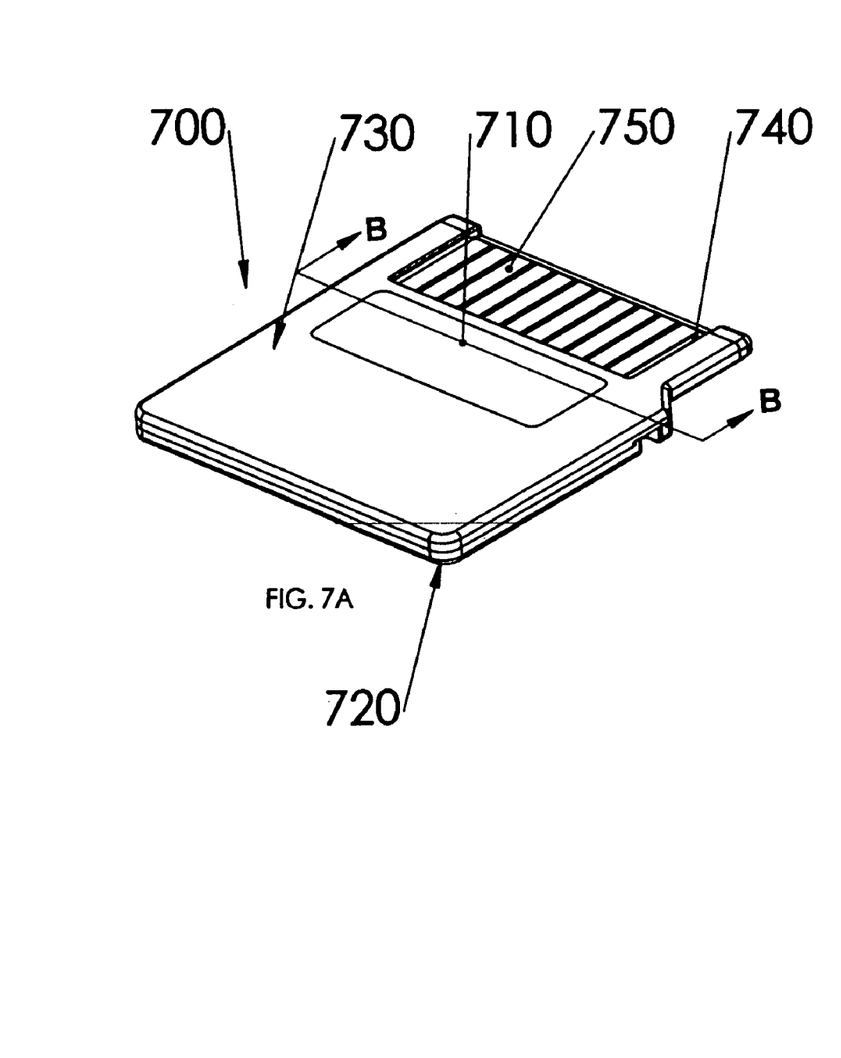
FIG. 7A shows a PC card including an inset panel.
Figure 7B:
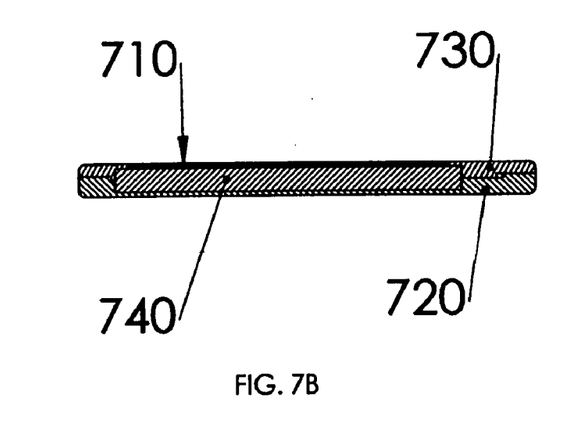
FIG. 7B is a cross-sectional view along line B—B of the PC card of FIG. 7A.

FIG. 7A shows an alternative embodiment of a PC card 700 that includes an inset panel 710. The PC card 700 is formed from a base 720, a lid 730, an inset panel 710, and an electronic device 740 that is partially enclosed by the base 720 and the lid 730. The lid 730 includes an opening for exposing an interface 750 of the electronic device 740 and an opening for the inset panel 710. FIG. 7B illustrates a cross-sectional view of PC card 700 taken along line B—B.

The inset panel 710 can provide a region of the housing having a contrasting color to the balance of the housing (or at least contrasting to the lid 730) that is suitable for labeling or printing. For example, a PC card 700 can include a black thermoplastic base 720 and lid 730, and a white inset panel 710, which can then be printed or handwritten on in a contrasting color. Conventionally, creating a label having a contrasting color background (e.g., a label of black text over a white background) requires printing a white field directly onto the lid and printing the text on top of the white field. Printing a white field onto a black lid can take several printing passes, requiring additional time and expense. After multiple passes, the white field may not be entirely opaque or fail to meet commercial specifications. Further, the multiple printing process can damage a delicate electronic device housed within the PC card.

Figure 8:
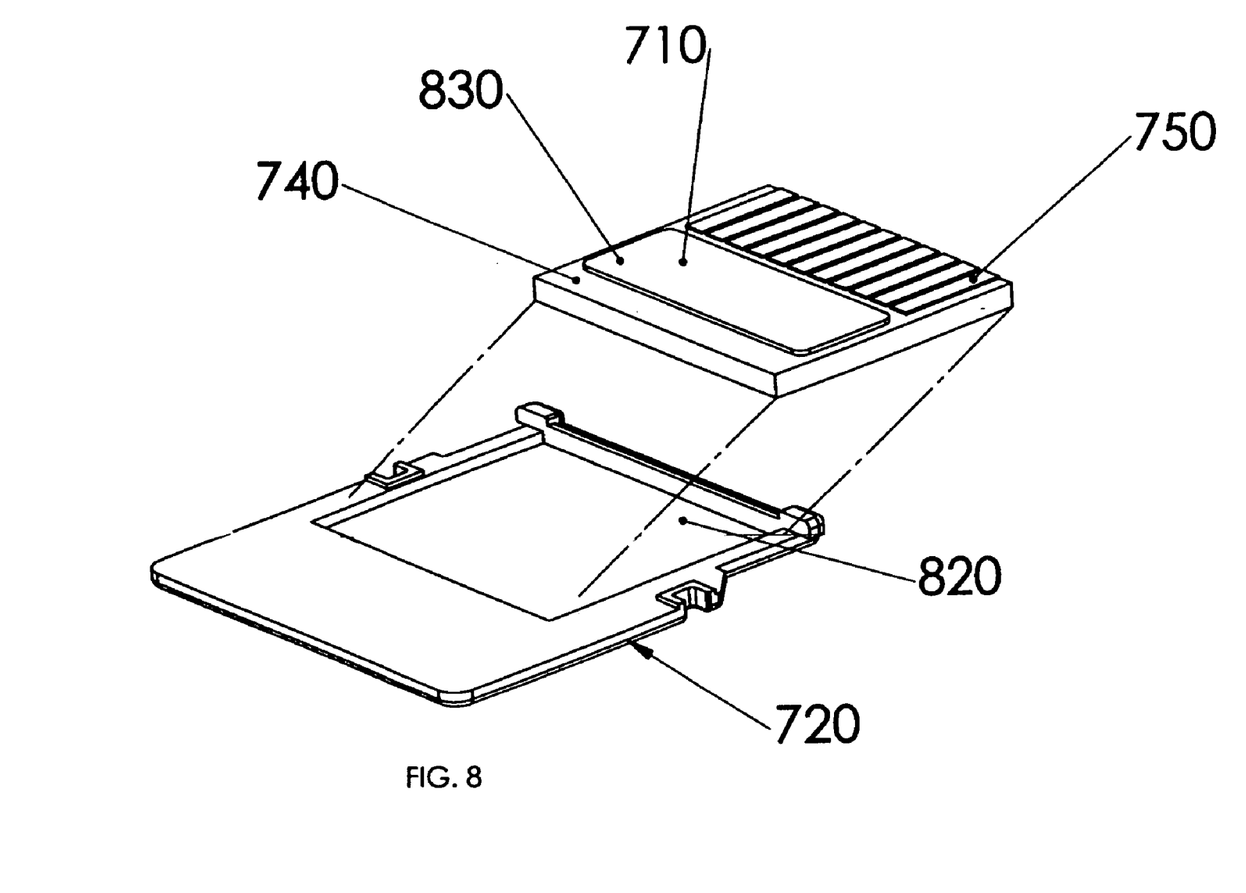
FIG. 8 is an exploded view of an electronic device, an inset panel, and a housing base.

Referring now to FIG. 8, an exploded view of the base 720 and the electronic device 740 with an attached inset panel 710 is shown. The base 720 is configured to receive an electronic device, for example, as described above in reference to FIGS. 2, 5, and 6. For illustrative purposes, the base 720 shown resembles the base 5 of FIG. 2. The inset panel 710, having a surface area 830 less than the surface area of the top surface of the electronic device 740, can be attached to the electronic device 740, for example, using an adhesive. Alternatively, the inset plastic panel 710 can be positioned so that some or all of the inset panel 710 contacts an upper surface of the base 720.

In one implementation, the inset panel 710 is placed within a recess formed in the base 720. The recess can be designed so that the inset panel 710 can be placed within the recess forming a friction fit between the inset panel 710 and base 720. The friction fit restricts the inset panel 710 from moving laterally when positioned upon the base 720, and the inset panel 710 is held stationary during the over-molding process. The inset panel can-be prefabricated using conventional techniques, for example, by injection molding or die-cutting, and can be formed from any suitable material, including, for example, a thermoplastic material such as an acrylonitrile butadiene styrene (ABS), polycarbonate, ABS-polycarbonate, styrene, polystyrene, acrylic, nylon or a polyester. The above list is not exhaustive and other suitable materials can be used. In one implementation the inset panel 710 has dimensions of approximately 8 mm×12 mm×0.1–0.3 mm for use with a PC card having dimensions of approximately 21.5 cm×20.0 cm×1.4 mm.

During over-molding, a shut-off mechanism is used to prevent molding over the top surface (or at least a portion) of the inset panel 710. In one embodiment, the lid 730 is co-planar with the inset panel 710. The over-molding material can be any suitable material, including, for example, a thermoplastic material such as an acrylonitrile butadiene styrene (ABS), polycarbonate, ABS-polycarbonate, styrene, polystyrene, acrylic, nylon or a polyester. The above list is not exhaustive and other suitable materials can be used. Over-molding with a molding material from a similar plastic family to the material used in base 720 and the inset panel 710 provides improved bonding between the lid 730 the base 720 and the inset panel 710. During the injection molding process, the molding material bonds to the base 720, some portion of the electronic device 740, as well the sides of (or at least some portion of) the inset panel 710.

In another implementation, the inset panel 710 is added to the PC card 700 after over-molding the lid 730. The base 720, including the electronic device 740, is placed within the injection mold 400 for over-molding. A shut-off mechanism is used to prevent the molding material from accumulating over at least a portion of the electronic device 740, and a recess is formed in the lid that is configured to receive the inset panel 710. The inset panel 710 is inserted into the recess and attached to the underlying the base 720 or the electronic device 740, for example using an adhesive or friction fit.

In another implementation, a lid or base can be created so that the lid or base includes the inset panel. For example, the inset panel can be previously molded or die-cut. The inset panel can then be placed within an injection mold and the lid or base molded to surround the inset panel. An electronic device can be positioned on the lid or base and a corresponding base or lid over-molded as described above. Alternatively, the resulting lid or base including the inset panel can then be mated to a pre-molded corresponding base or lid using conventional techniques such as sonic welding.

A robotic or computer controlled apparatus can be used to perform some of the steps described herein, such as to position a electronic device onto a base, to transfer a base to the injection mold for over molding and/or to remove a PC card from an injection mold.

Although only a few embodiments have been described in detail above, other modifications are possible. For example, the techniques described can be used to at least partially enclose more than one electronic device in a housing. A housing can be configured other than as a rectilinear solid. The techniques described herein are not limited to forming a "PC card" and can be used to house any electronic device. The steps of the methods disclosed herein can be performed in a different order and still achieve desirable results. Other embodiments may be within the scope of the following claims.

The invention claimed is:

1. An apparatus, comprising:
   a base including:
      an edge portion extending inward from a perimeter of the base by a predefined width; and
      an interior portion interior to the edge portion, to interior portion having a first region and a second region, the first and second regions not overlapping;
      an eletronic device contacting the first region of the interior portion; and
   a lid over-molded to cover at least a portion of the base and the electronic device, the lid being bonded to the second region of the interior portion and to a surface of the edge portion where the surface of the edge portion is substantially parallel to the interior portion.

2. The apparatus of claim 1, wherein die electronic device is a thin walled semiconductor device.

3. The apparatus of claim 1, wherein the electronic device is a printed circuit boar.

4. The apparatus of claim 3, wherein the printed circuit board is a flash memory module.

5. The apparatus of claim 1, wherein the electronic device is adhered to the base prior to over-molding the lid.

6. The apparatus of claim 1, wherein the base includes a recess configured to receive the electronic device.

7. The apparatus of claim 1, wherein the base includes one or more raised members and the electronic device includes one or more corresponding recesses, and wherein the one or more raised members are configured to engage the one or more recesses.

8. The apparatus of claim 1, wherein:
   the lid includes an opening;
   the electronic device includes an interface; and
   the interface is accessible through the opening in the lid.

9. The apparatus of claim 1, wherein:
   the base includes an opening;
   the electronic device includes an interface; and
   the interface is accessible through the opening in the base.

10. The apparatus of claim 1, wherein:
    the lid includes an opening;
    the base includes an opening;
    the electronic device includes one or more interfaces; and
    the one or more interfaces are accessible through the opening in the base and the opening in the lid.

11. The apparatus of claim 1, wherein the base is formed from a plastic material.

12. The apparatus of claim 1, wherein the lid is formed from a thermoplastic material.

13. The apparatus of claim 12, wherein the thermoplastic material is acrylonitrile butadiene styrene (ABS).

14. An apparatus, comprising:
    a base, including:
       an edge portion extending inward from a perimeter of the base by a predefined width; and
       an interior portion interior to the edge portion, the interior portion having a first region and a second region, the first and second regions not overlapping
    an electronic device contacting the first region of the interior portion;
    a panel positioned on at least one of the base and the electronic device, the panel having a surface area less than the surface area of the base; and
    a lid over-molded to cover at least a portion of the base and the electronic device, the lid being bonded to the second region of the interior portion and to a surface of the edge portion where the surface of the edge portion is substantially parallel to the interior portion, wherein an upper surface of the panel remains substantially exposed.

15. The apparatus of claim 14, wherein the panel is fanned by injection molding.

16. The apparatus of claim 14, wherein the panel is formed from a plastic material.

17. The apparatus of claim 14, wherein the panel is die-cut.

18. The apparatus of claim 14, wherein the panel is adhered to the base.

19. The apparatus of claim 14, wherein the panel is Adhered to the electronic device.

20. An apparatus, comprising:
a base, including:
a raised edge portion extending along at least a portion of a perimeter of the base; and;
an interim portion interior to the edge portion, the interior portion having a first region and a second region, the first and second regions not overlapping;
an electronic device contacting the first region of the interior portion; and
a lid over-molded to cover at least a portion of the base and the electronic device, the lid being bonded to the second region of the interior portion and to a surface of the edge portion where the surface of the edge portion is substantially parallel to the interior portion, the lid and the base housing the electronic device.

21. An apparatus, comprising:
a generally flat base having and first side and a second side, the first side having a first surface and the second side having a second surface where the first surface is substantially parallel to the second surface, the second surface including:
an edge portion extending inward from a perimeter of the base by a predefined width; and
an interior portion interior to the edge portion, the interior portion having a first region and a second region where the first and second regions are not overlapping;
an electronic device contacting the first region of the interior portion; and
a generally flat lid over-molded to cover at least a portion of to base and to electronic device, the lid having an outer side and an inner side, the outer side having an outer surface substantially parallel to the first aide of the base, to inner side bonded to the second region of the interior portion and to a surface of the edge portion where the surface of the edge portion is substantially parallel to the interior portion.

22. The apparatus of claim 21, wherein the electronic device is a thin walled semiconductor device.

23. The apparatus of claim 21, wherein to electronic device is a printed circuit board.

24. The apparatus of claim 21, wherein to printed circuit board is a flash memory module.

25. The apparatus of claim 21, wherein the first region of the base includes a recess configured to receive the electronic device.

26. The apparatus of claim 25, wherein to recess is configured to hold the electronic device in position during over-molding of the lid.

27. The apparatus of claim 21, wherein the base includes one or more raised members and the electronic device includes one or more corresponding recesses, and wherein the one or more raised members are configured to engage the one or more recesses.

28. The apparatus of claim 21, wherein:
the lid includes an opening;
the electronic device includes an interface; and
the interface is accessible through the opening in the lid.

29. The apparatus of claim 21, wherein:
the base includes an opening;
the electronic device includes an interface; and
the interface is accessible through the opening in the base.

30. The apparatus of claim 21, wherein:
the lid includes an opening
the base includes an opening;
the electronic device includes one or more interfaces; and
the one or more interfaces are accessible through the opening in the base and the opening in the lid.

31. The apparatus of claim 21, wherein the base is formed from a plastic material.

32. The apparatus of claim 21, wherein the lid is formed from a thermoplastic material.

* * * * *